US008150068B2

(12) United States Patent
Konagai et al.

(10) Patent No.: US 8,150,068 B2
(45) Date of Patent: Apr. 3, 2012

(54) ARRAY SPEAKER SYSTEM

(75) Inventors: Yusuke Konagai, Hamamatsu (JP); Susumu Takumai, Hamamatsu (JP)

(73) Assignee: Yamaha Corporation (JP)

( * ) Notice: Subject to any disclaimer, the term of this patent is extended or adjusted under 35 U.S.C. 154(b) by 1245 days.

(21) Appl. No.: 11/817,074

(22) PCT Filed: Feb. 23, 2006

(86) PCT No.: PCT/JP2006/303319

§ 371 (c)(1), (2), (4) Date: Aug. 24, 2007

(87) PCT Pub. No.: WO2006/090799

PCT Pub. Date: Aug. 31, 2006

(65) Prior Publication Data

US 2009/0060237 A1 Mar. 5, 2009

(30) Foreign Application Priority Data

Feb. 25, 2005 (JP) ................................ 2005-051099

(51) Int. Cl.
*H04R 5/00* (2006.01)
*H03G 5/00* (2006.01)

(52) U.S. Cl. ........................................... 381/99; 381/17

(58) Field of Classification Search .................... 381/98, 381/99, 310, 317, 307, 17, 80, 1
See application file for complete search history.

(56) References Cited

U.S. PATENT DOCUMENTS 3,772,479 A 11/1973 Hilbert
4,024,344 A 5/1977 Dolby et al.
4,118,601 A 10/1978 Yeap
4,227,160 A 10/1980 Tamori et al.
4,472,834 A 9/1984 Yamamuro et al.
(Continued)

FOREIGN PATENT DOCUMENTS

CA 2107320 C 3/1997
(Continued)

OTHER PUBLICATIONS

Notification of the First Office Action with the Office Action of Chinese Application No. 2006800060275, Issued May 8, 2009.

(Continued)

*Primary Examiner* — Vivian Chin
*Assistant Examiner* — Andrew Graham
(74) *Attorney, Agent, or Firm* — Rossi, Kimms & McDowell LLP

(57) ABSTRACT

Signals on respective RL, FL, C, FR, RR channels are divided into high frequency signals and low frequency signals by HPFs and LPFs respectively. The low frequency signals on the RL, FL, and C channels are superposed and output from a left-side woofer 21-1, while the low frequency signals on the RR, FR, and C channels are superposed and output from a right-side woofer 21-2. A predetermined directivity is given to the high frequency signals on respective channels by directivity controlling portions 17-1 to 17-5 respectively, and resultant signals are output from respective speaker units 20-1 to **20-*n*** of an array speaker to generate virtual sound sources by the reflection from wall surfaces. A crossover frequency f2 of the rear channels (RL, RR) is set higher than a crossover frequency f1 of the front channels (FL, FR), and the signals on the rear channels are shaped into a narrow beam to generate a high-quality surround sound field.

2 Claims, 5 Drawing Sheets

U.S. PATENT DOCUMENTS

| | | | | |
|---|---|---|---|---|
| 4,503,553 | A | 3/1985 | Davis | |
| 4,984,273 | A | 1/1991 | Aylward et al. | |
| 4,991,687 | A | 2/1991 | Oyaba et al. | |
| 5,109,419 | A | 4/1992 | Griesinger | |
| 5,233,664 | A | 8/1993 | Yanagawa et al. | |
| 5,524,054 | A | 6/1996 | Spille | |
| 5,631,714 | A | 5/1997 | Saadoun | |
| 5,666,424 | A | 9/1997 | Fosgate et al. | |
| 5,675,655 | A | 10/1997 | Hatae | |
| 5,930,373 | A | 7/1999 | Shashoua et al. | |
| 5,953,432 | A | 9/1999 | Yanagawa et al. | |
| 6,005,948 | A | 12/1999 | Maeda | |
| 6,128,395 | A | 10/2000 | DeVries | |
| 6,181,796 | B1 | 1/2001 | Johnson | |
| 6,240,189 | B1 | 5/2001 | Aylward | |
| 6,285,891 | B1 | 9/2001 | Hoshino | |
| 6,498,852 | B2 | 12/2002 | Grimani | |
| 6,535,610 | B1 | 3/2003 | Stewart | |
| 6,804,361 | B2 * | 10/2004 | Hosoi et al. | 381/99 |
| 7,054,448 | B2 | 5/2006 | Yoshino et al. | |
| 7,319,641 | B2 | 1/2008 | Goudie et al. | |
| 7,515,719 | B2 | 4/2009 | Hooley et al. | |
| 7,720,237 | B2 * | 5/2010 | Bharitkar et al. | 381/98 |
| 7,822,496 | B2 * | 10/2010 | Asada et al. | 700/94 |
| 7,826,626 | B2 * | 11/2010 | Bharitkar et al. | 381/99 |
| RE42,390 | E * | 5/2011 | Hosoi et al. | 381/99 |
| 2001/0016047 | A1 | 8/2001 | Ohta | |
| 2002/0191807 | A1 | 12/2002 | Asada et al. | |
| 2003/0185404 | A1 | 10/2003 | Milsap | |
| 2004/0071299 | A1 | 4/2004 | Yoshino | |
| 2004/0151325 | A1 | 8/2004 | Hooley et al. | |
| 2004/0252844 | A1 * | 12/2004 | Christensen et al. | 381/17 |
| 2005/0089182 | A1 * | 4/2005 | Troughton et al. | 381/307 |
| 2005/0271230 | A1 | 12/2005 | Sasaki | |
| 2006/0050897 | A1 | 3/2006 | Asada et al. | |
| 2006/0153391 | A1 | 7/2006 | Hooley et al. | |
| 2006/0204022 | A1 | 9/2006 | Hooley et al. | |
| 2006/0233378 | A1 * | 10/2006 | Kim et al. | 381/1 |
| 2007/0076905 | A1 | 4/2007 | Konagai et al. | |
| 2007/0165878 | A1 | 7/2007 | Konagai | |
| 2007/0217621 | A1 | 9/2007 | Takumai | |
| 2008/0159545 | A1 | 7/2008 | Takumai | |
| 2008/0226093 | A1 | 9/2008 | Kushida | |
| 2009/0296943 | A1 * | 12/2009 | Martin | 381/17 |

FOREIGN PATENT DOCUMENTS

| | | | |
|---|---|---|---|
| CN | 1754403 | A | 3/2006 |
| GB | 1122851 | | 8/1968 |
| GB | 2273848 | A | 6/1994 |
| GB | 2373956 | A | 10/2002 |
| JP | 05-041897 | A | 2/1993 |
| JP | 5276591 | A | 10/1993 |
| JP | 6-38289 | A | 2/1994 |
| JP | 06062488 | A | 3/1994 |
| JP | 6-205496 | A | 7/1994 |
| JP | 6209500 | A | 7/1994 |
| JP | 06-225379 | A | 8/1994 |
| JP | 6261385 | A | 9/1994 |
| JP | 6269096 | A | 9/1994 |
| JP | 9-121400 | A | 6/1997 |
| JP | 9233591 | A | 9/1997 |
| JP | 9-259539 | A | 10/1997 |
| JP | 11-27604 | A | 1/1999 |
| JP | 11027604 | A | 1/1999 |
| JP | 11-136788 | A | 5/1999 |
| JP | 2001-025084 | A | 5/1999 |
| JP | 11-69474 | A | 9/1999 |
| JP | 2000-184488 | A | 6/2000 |
| JP | 2001-346297 | A | 12/2001 |
| JP | 2002-345077 | A | 11/2002 |
| JP | 2003023689 | A | 1/2003 |
| JP | 2003-510924 | A | 3/2003 |
| JP | 2003-230071 | A | 8/2003 |
| JP | 2004172661 | A | 6/2004 |
| JP | 2004172703 | A | 6/2004 |
| JP | 2004-186895 | A | 7/2004 |
| JP | 2004193698 | A | 7/2004 |
| JP | 2004-531125 | A | 10/2004 |
| JP | 2004-336530 | A | 11/2004 |
| JP | 2004-349795 | A | 12/2004 |
| JP | 2004-363695 | A | 12/2004 |
| JP | 2004-363697 | A | 12/2004 |
| JP | 2004350173 | A | 12/2004 |
| JP | 2005-12765 | A | 1/2005 |
| JP | 2005027020 | A | 1/2005 |
| JP | 2006238155 | A | 2/2005 |
| JP | 2005080079 | A | 3/2005 |
| JP | 2006319390 | A | 5/2005 |
| JP | 2006-067301 | A | 3/2006 |
| JP | 2006-518956 | A | 8/2006 |
| JP | 2006-304128 | A | 11/2006 |
| WO | 0123104 | A2 | 4/2001 |
| WO | 0278388 | A2 | 3/2002 |
| WO | 03071827 | A2 | 8/2003 |
| WO | WO 3071827 | A2 * | 8/2003 |
| WO | WO 2004047490 | A1 * | 6/2004 |
| WO | 2004/066673 | A1 | 8/2004 |
| WO | 2004/075601 | A1 | 9/2004 |
| WO | 2005015956 | A1 | 2/2005 |

OTHER PUBLICATIONS

International Search Report issued in the corresponding application No. PCT/JP2006/303319, mailed on May 16, 2006.

Notification of Reason for Refusal issued in corresponding Japanese Patent Application No. 2005-051099 dated Sep. 7, 2010. English translation provided.

Supplementary European Search Report in co-pending U.S. Appl. No. 10/585,269 which corresponds to EP 05703397.9-2225 dated Aug. 6, 2007.

Meyer, David G.; "Digital Control of Loudspeaker Array Directivity"; Journal of the Audio Engineering Society; Oct. 1984; pp. 747-754; vol. 32-No. 12; New York, USA in co-pending U.S. Appl. No. 10/585,269.

Supplementary European Search Report in co-pending U.S. Appl. No. 10/585,269 which corresponds to EP 04808086.5 dated Sep. 29, 2009.

International Search Report in co-pending U.S. Appl. No. 10/585,269 which corresponds to PCT/JP2004/019736 dated Apr. 19, 2005.

Notification of Reasons for Refusal in co-pending U.S. Appl. No. 10/585,269 which corresponds to JP 2004-000675.

Notification of Reasons for Refusal in co-pending U.S. Appl. No. 10/585,269 which corresponds to JP 2004-000675, dated Feb. 19, 2008.

Decision of Refusal in co-pending U.S. Appl. No. 10/585,269 which corresponds to 2004-000675, dated May 20, 2008.

Notification of Reason for Refusal in co-pending U.S. Appl. No. 10/585,269 which corresponds to JP 2003-429819, dated Apr. 8, 2008.

Notification of Reason for Refusal in co-pending U.S. Appl. No. 10/585,655 which corresponds to JP 2004-002511, dated Jan. 22, 2008.

Notification of Reason for Refusal in co-pending U.S. Appl. No. 10/585,655 which corresponds to 2004-002511, dated Aug. 26, 2008.

Supplementary European Search Report in co-pending U.S. Appl. No. 10/585,655 which corresponds to 05703396.1 dated Jun. 25, 2010.

"Wideband Beamforming by Means of Multiple Band-Division Using Dolph-Chebyshev Spatial Filters"; Journal of Institute of Electronics, Information and Communication Engineers; Dec. 1995; pp. 1576-1584; vol. J78-A. in co-pending U.S. Appl. No. 12/044,603.

Notification of Reason for Refusal in co-pending U.S. Appl. No. 12/044,603, which corresponds to EP 08003945.6-2225, dated Jul. 7, 2008. English language translation provided.

Ohya et al; "Directional Array Speakers with the Specified Beam Direction by means of a Band-Division Design"; 10th Digital Signal Processing Symposium; Nov. 1-2, 1995; pp. 59-64. Specification; English abstract provided in co-pending U.S. Appl. No. 12/044,603.

* cited by examiner

ARRAY SPEAKER SYSTEM

This application is a U.S. National Phase Application of PCT International Application PCT/JP2006/303319 filed on Feb. 23, 2006 which is based on and claims priority from JP 2005-051099 filed on Feb. 25, 2005, the contents of which is incorporated herein in its entirety.

TECHNICAL FIELD

The present invention relates to an array speaker system constructed to implement a surround reproduction by outputting multichannel sound beams to generate virtual sound sources by a reflection from the wall.

BACKGROUND ART

In the speaker system of the delay array system, a number of speaker units arranged linearly or arranged on a plane output the same sound signal while giving a slightly different delay time to the signal such that these sound signals arrive at a certain point (focal point) in a space simultaneously, so that acoustic energy around the focal points is enhanced by the in-phase addition and as a result the sharp directivity, i.e., the sound beam is generated in the direction of the focal point.

Then, when the above delay process is applied to each channel of the multiple channels respectively and then signals on all channels are added together before they are output to the speaker unit, output signals on the multiple channels provide the sound beams each having a different directivity on each channel respectively because the speaker unit and the space are the substantially linear system.

Accordingly, a large sound volume can be provided to only a hearing-impaired person by enhancing the directivity in the particular direction (Patent Literature 1), two persons can listen simultaneously to different contents respectively by giving the different directivity to sounds of two different contents respectively (Patent Literature 2), or a surround sound field can be generated by causing the sound beams on the multichannels containing the surround to reflect partially from the walls and generating the virtual sound sources (Patent Literature 3).

FIG. 3 is a view showing a situation in which virtual sound sources are generated near the walls by directing plural beams at any walls of the room to reflect from there and thus a multichannel surround sound field is generated.

In FIG. 3, 31 is a listening room, 32 is a video system, 33 is an array speaker, 34 is a listener, 35 is a wall surface on the left side of the listener, 36 is a wall surface on the right side of the listener, and 37 is a wall surface on the rear side of the listener. Here, explanation will be made under the assumption that the five-channel reproduction is carried out hereunder. The sound signal is generated forward from the array speaker 33 based on the center (C) channel signal, a virtual FL channel sound source 38 is generated based on the front left (FL) channel signal by controlling the beam to direct it at the wall surface 35 on the left side of the listener, and a virtual FR channel sound source 39 is generated based on the front right (FR) channel signal by controlling the beam to direct it at the wall surface 36 on the right side of the listener. Also, a virtual RL channel sound source 40 is generated based on the rear left (RL) channel signal by controlling the beam to direct it at the rear-side wall surface 37 from the left-side wall 35, and a virtual RR channel sound source 41 is generated based on the rear right (RR) channel signal by controlling the beam to direct it at the rear-side wall surface 37 from the right-side wall 36.

In this manner, the signals on respective FL (front left), FR (front right), RL (rear left), and RR (rear right) channels are shaped into the beams by giving the sharp directivity to them, and then the listener 34 is caused to feel the sound sources in the wall direction based on the beams reflected from the walls. Therefore, the surround sound field can be generated by the virtual sound sources while using one array speaker provided on the front side.

Meanwhile, the frequency band whose directivity can be controlled by the array speaker is decided physically by the array profile. In other words, the wavelength that is longer that a full width of the array (low frequency) or the wavelength that is shorter than a pitch between the speaker units (high frequency) cannot be controlled by the array speaker. Thus, actually a small-sized wide-range speaker is employed as the speaker unit to control the high frequency band to some extent. Since the array speaker cannot control the low frequency band unless a full width of the array is expanded even if the user tries to control the directivity of the low frequency band, a number of speaker units are needed. As a result, the system in which the low frequency is not shaped into the beam and is output separately has been proposed (Patent Literature 3).

FIG. 4 is a block diagram showing a configuration of the array speaker system that does not shape the low frequency band into the beam. In FIG. 4, 33 is the above array speaker that is constructed by a plurality (n) of speaker units 33-1 to 33-*n*.

As shown in FIG. 4, the signals on respective center (C), front left (FL), front right (FR), rear left (RL), and rear right (RR) channels are input into the subband filters provided to correspond to respective channels. Each subband filter is composed of a set of a high-pass filter (HPF) and a low-pass filter (LPF). The signals on respective channels are divided into a signal (high frequency component) having a frequency higher than a crossover frequency (crossover frequency) that passes through HPFs 51-1 to 51-5 selectively and a signal (low frequency component) having a frequency lower than the crossover frequency that passes through LPFs 52-1 to 52-5 selectively respectively.

The low frequency components of the signals on respective channels, which are passed through LPFs 52-1 to 52-5, are added by an adder 53, and then an added signal is input into a signal adjusting portion (ADJ portion) constituted by a gain controlling portion 54-6, a frequency characteristic correcting portion 55-6, and a delay circuit 56-6. Here, the level and the frequency characteristic of the signal are corrected and a resultant signal is delayed in a predetermined time.

Also, the high frequency components of the signals on respective channels, which are passed through HPFs 51-1 to 51-5, are input into a signal adjusting portion constituted by gain controlling portions 54-1 to 54-5, frequency characteristic correcting portions (EQs) 55-1 to 55-5, and delay circuits 56-1 to 56-5, which are provided to correspond to respective channels. Here, the level and the frequency characteristic of the signals are corrected respectively and resultant signals are delayed in a predetermined time respectively. Then, signals are input into directivity controlling portions (Dir C) 57-1 to 57-5 provided to correspond to respective channels respectively, so that signals on respective channels being output to the speaker units 33-1 to 33-*n* of the array speaker 33 to have the directivity shown in FIG. 3 are generated. Delay circuits and gain setting portions corresponding to respective speaker units 33-1 to 33-*n* are provided to the directivity controlling portions 57-1 to 57-5, where an amount of delay is set to direct the beam in the direction allocated to the channel and a window factor is a multiplied to reduce the side lobes. Thus, signals being output to respective speaker units 33-1 to **33-*n*** are generated.

The signals output from the directivity controlling portions 57-1 to 57-5, which have a higher frequency than the crossover frequency of each channel respectively and correspond to respective speaker units, and a signal output from the delay circuit 55-6, which has a frequency lower than the crossover frequencies of all channels, are input into adders 58-1 to **58-*n*** provided to correspond to respective speaker units, and are added respectively.

The signals output from the adders 58-1 to **58-*n* are amplified by power amplifiers 59-1 to 59-*n* provided to correspond to respective speaker units 33-1 to 33-*n*, and are output from the corresponding speaker units 33-1 to 33-*n***.

In this manner, the signals whose frequency is lower than the crossover frequency respectively are not shaped into the beam on all channels and then output, while the signals whose frequency is higher than the crossover frequency respectively are shaped into the beam as shown in FIG. 3 and then output.

Patent Literature 1: JP-A-11-136788

Patent Literature 2: JP-A-11-27604

Patent Literature 3: WO01/023104 (JP-T-2003-510924)

DISCLOSURE OF THE INVENTION

Problems that the Invention is to Solve

When the directivity is controlled by the delay array system, the directional pattern of the array speaker is decided depending on a relationship between a total width of the array and a wavelength. The main lobe has a narrow profile in the high frequency band, and the main lobe has a broad profile in the low frequency band.

FIG. 5 is a view showing an example of the directional pattern of the array speaker. As shown in FIG. 5, the higher the frequency becomes, the narrower the width of the main lobe becomes. That is, this directional pattern has such a tendency that the directivity becomes wide in the low frequency band.

Since the beams of the front channels (FL, FR) and the beams of the rear channels (RL, RR) are generated by the same system, the above array speaker system in the prior art has the problem in quality of the surround sound field.

More particularly, such a problem exists that the front channel signals are heard from the side-front wall, per contra, the rear channel signals are heard directly from the array speaker, in other words, from the front. The reasons for this are that the beams corresponding to the main lobe are attenuated (6 dB every twice) according to a distance because the beam path on the rear channel is longer than that on the front channel, as shown in above FIG. 3, and that the sound generated from the virtual sound source is overpowered by the acoustic energy, which is emitted from the front direction located at the edge of the main lobe, in the low frequency band in which the directivity is broad. In addition, since a time delay is caused by a long distance, the rear channels are disadvantageous in the Hass effect respect.

Also, as shown in FIG. 3, the beam on the rear channel has a smaller angle to the front direction than the beam on the front channel and thus an angle difference between the direction of the main lobe and the listener is small. In other words, the sounds are easily overlapped because the beam passes closely to the listener.

As a result, there is such a problem that the rear echolocation of the rear channel becomes difficult.

As another problem, there exists a time alignment of the rear channels. To the extent a distance of the beam path of the rear channel is prolonged, the beams on the rear channels must be output earlier to coincide in timing with the low frequency components of the rear channels that are not shaped into the beam. However, in a situation that the low frequency components of the beams are heard from the front for the above reason, the sounds on the rear channels are heard at varied timings depending on the frequency band.

Therefore, it is an object of the present invention to aim at improving a quality of a generated surround sound field in an array speaker system that generates a surround sound field by outputting multichannel sound beams from array speakers to generate virtual sound sources by the wall reflection.

Means for Solving the Problems

In order to achieve the above object, an array speaker system of the present invention includes array speakers which generate sound beams having a plurality of different directivities for generating a surround sound source containing front channels and rear channels by utilizing a wall reflection; a frequency band dividing unit which divides a signal on the front channels into a first high frequency band signal and a first low frequency band signal at a first crossover frequency, and divides a signal on the rear channels into a second high frequency band signal and a second low frequency band signal at a second crossover frequency; a first outputting unit which shapes the first high frequency band signal in the signal on the front channels in a frequency band higher than the first crossover frequency and the second high frequency band signal in the signal on the rear channels in a frequency band higher than the second crossover frequency into a sound beam, and then outputs shaped signals; and second outputting unit which outputs the first low frequency band signal in the signal on the front channels in a frequency band lower than the first crossover frequency and the second low frequency band signal in the signal on the rear channels in a frequency band lower than the second crossover frequency not to shape the signals into the sound beam; wherein the second crossover frequency is set to a higher frequency than the first crossover frequency.

Also, the array speaker system of the present invention further includes a low frequency band reproducing speaker which is provided separately from the array speaker; wherein the low frequency band reproducing speaker outputs the first low frequency band signal and the second low frequency band signal.

ADVANTAGES OF THE INVENTION

According to such array speaker system of the present invention, particularly a quality of the rear channel can be improved by making an optimum beam design for the front channels and the rear channels respectively. More particularly, the stable sound image having a good echolocation feeling can be generated because the front channels are shaped into the beam over a broad band, while the problem of echolocation and the problem of time alignment can be lessened because the rear channels are limited in a high-frequency narrow band to constitute a narrow beam.

Also, when the two-way system in which the signal in the low frequency band is output from the low-frequency band reproducing speaker is employed, a low-frequency band reproducing capability can be improved and the music reproduction with good balance in a broad band can be achieved.

DESCRIPTION OF REFERENCE NUMERALS

11-1 to 11-5: high-pass filter
12-1 to 12-5: low-pass filter
13-1 to 13-2: adder
14-1 to 14-7: gain controlling portion
15-1 to 15-7: frequency characteristic correcting portion
16-1 to 16-7: delay circuit
17-1 to 17-5: directivity controlling portion
18-1 to **18-*n***: adder
19-1 to **19-*n*, 29-1, 29-2**: power amplifier
20: array speaker
20-1 to **20-*n***: speaker unit
21-1, 21-2: low-frequency band reproducing speaker

BEST MODE FOR CARRYING OUT THE INVENTION

Figure 1:
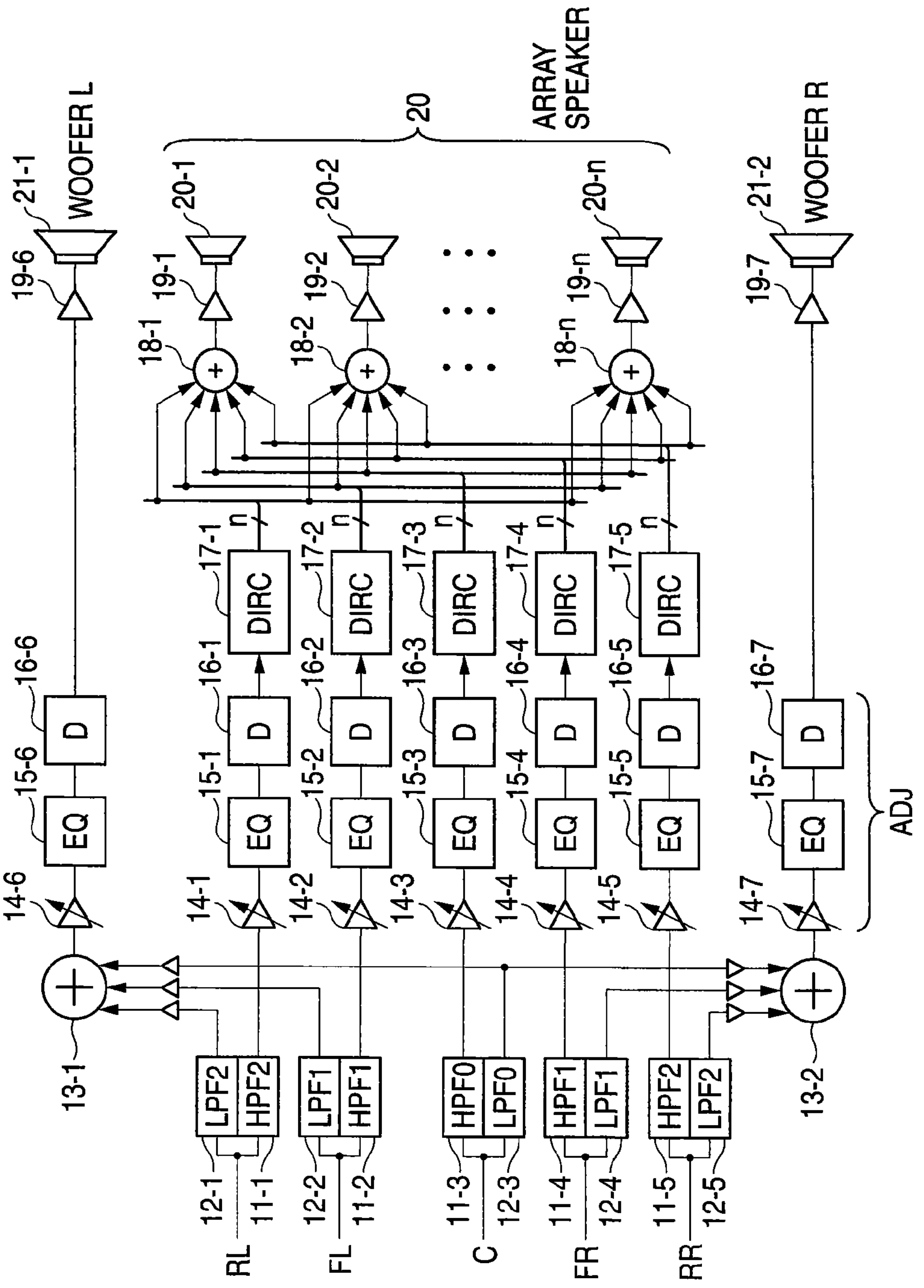
FIG. 1 A block diagram showing a configuration of an embodiment of an array speaker system of the present invention.

FIG. 1 is a block diagram showing a configuration of an embodiment of an array speaker system of the present invention.

The array speaker system of the present invention employs the two-way system in which the frequency band is divided into two bands. The high frequency band is shaped into the beam by using an array speaker 20 constituted by a plurality (n) of speaker units 20-1 to **20-*n* and output, while the low frequency band is not shaped into the beam and output from low-frequency band reproducing speakers (woofers) 21-1, 21-2**.

Figure 2:
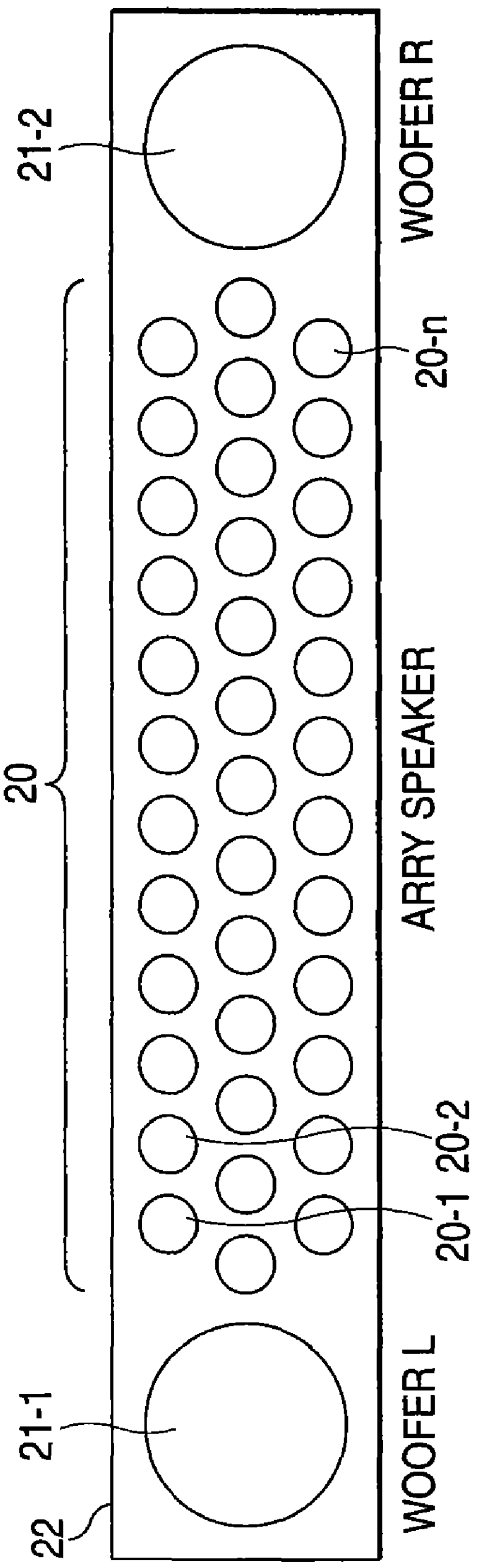
FIG. 2 A view showing an outer appearance of a speaker portion in the embodiment of the array speaker system of the present invention.

FIG. 2 is a view showing an outer appearance of the speaker portion in the embodiment of the array speaker system of the present invention.

As shown in FIG. 2, the array speaker 20 having n speaker units is arranged in the center portion of a case 22 of the speaker, and the woofer 21-1 is provided on the left side of the array speaker 20 while facing to the array speaker system and the woofer 21-2 is provided on the right side of the array speaker 20.

In this manner, the music reproduction with good balance can be expected over the broad band by employing the two-way system.

In FIG. 1, the signals on respective RL (rear left), FL (front left), C (center), FR (front right), and RR (rear right) channels are input into the subband filters constituted by high-pass filters (HPFs) 11-1 to 11-5 and low-pass filters (LPFs) 12-1 to 12-5, which are provided to correspond to the channels respectively, and are divided into the high frequency component that is higher than the crossover frequency and the low frequency component that is lower than the crossover frequency.

Here, in the present invention, suppose that the frequency dividing filters having at least two types of crossover frequencies are provided.

In more detail, the front channels (FL, FR) are requested to form the stable echolocation on the wall side of the listening room. Therefore, the crossover frequency f1 of HPF 11-2, LPF 12-2, HPF 11-4, and LPF 12-4 of the front channels (FL, FR) should be set inevitably to the lower frequency to shape as wider the frequency band as possible into the beam. For example, if a total width of the array is set to 1 m, the directivity can be provided up to almost 300 Hz that is a wavelength equivalent to this size, and thus the wavelength around here becomes an aim of the crossover frequency f1.

Also, since the rear channels (RL, RR) must pass the narrower beam than those of the front channels beside the listener while keeping the sharp directivity, only the wavelength that is sufficiently shorter than the total width of the array should be shaped into the beam. Therefore, the crossover frequency f2 of HPF 11-1, LPF 12-1, HPF 11-5, and LPF 12-5 of the rear channels (RL, RR) should be set higher than the crossover frequency f1 of the front channels (f2>f1).

In addition, the crossover frequency f0 of HPF 11-3 and LPF 12-3 for the center channel (C) should be set to the same extent as the crossover frequency of the front channels (FL, FR) in view of the sound quality balance with the front channels (FL, FR) (f0=f1). Otherwise, the crossover frequency f0 may be decided based on the reproducing characteristics of the speaker unit and the woofers as the criterion.

The low frequency component of the signal passed through the LPF 12-1 on the RL channel (the signal having a frequency lower than the frequency f2), the low frequency component of the signal passed through the LPF 12-2 on the FL channel (the signal having a frequency lower than the frequency f1), and the low frequency component of the signal passed through the LPF 12-3 on the C channel (the signal having a frequency lower than the frequency f0) are added by an adder 13-1. At this time, an addition can be done while giving a weight set arbitrarily to the signals on respective channels. For example, a weight of 1 is given to the RL channel and the FL channel respectively, and a weight of $\alpha$ ($0<\alpha<1$) is given to the C channel. A signal of the low frequency component output from the adder 13-1 on the RL channel and the FL channel is set to a predetermined gain by a gain controlling portion 14-6, then the frequency characteristic of a resultant signal is corrected to a predetermined frequency characteristic by a frequency characteristic correcting portion 15-6, then a resultant signal is delayed by a predetermined time by a delay circuit 16-6, and then a resultant signal is output from the left-side woofer 21-1 via a power amplifier 29-1.

The low frequency component of the signal passed through the LPF 12-5 on the RR channel (the signal having a frequency lower than the frequency f2), the low frequency component of the signal passed through the LPF 12-4 on the FR channel (the signal having a frequency lower than the frequency f1), and the low frequency component of the signal passed through the LPF 12-3 on the C channel (the signal having a frequency lower than the frequency f0) are added by an adder 13-2 while giving a predetermined weight, as described above. Then, as described above, a signal of the low frequency component output from the adder 13-2 on the RR channel and the FR channel is subjected to a predetermined process by a gain controlling portion 14-7, a frequency characteristic correcting portion 15-7, and a delay circuit 16-7 respectively, then a resultant signal is amplified by a power amplifier 29-2, and then a resultant signal is output from the right-side woofer 21-2.

In this manner, the low frequency components (weighted by $1:1:\alpha$) of the signals on the left-side channels (RL, FL) and the center channel is output from the left-side woofer 21-1, and the low frequency components (weighted by $1:1:\alpha$) of the signals on the right-side channels (RR, FR) and the center channel is output from the right-side woofer 21-2. In this case, contents of the process in the gain controlling portions 14-6, 14-7, the frequency characteristic correcting portions 15-6, 15-7, and the delay circuits 16-6, 16-7 will be described later.

Figure 3:
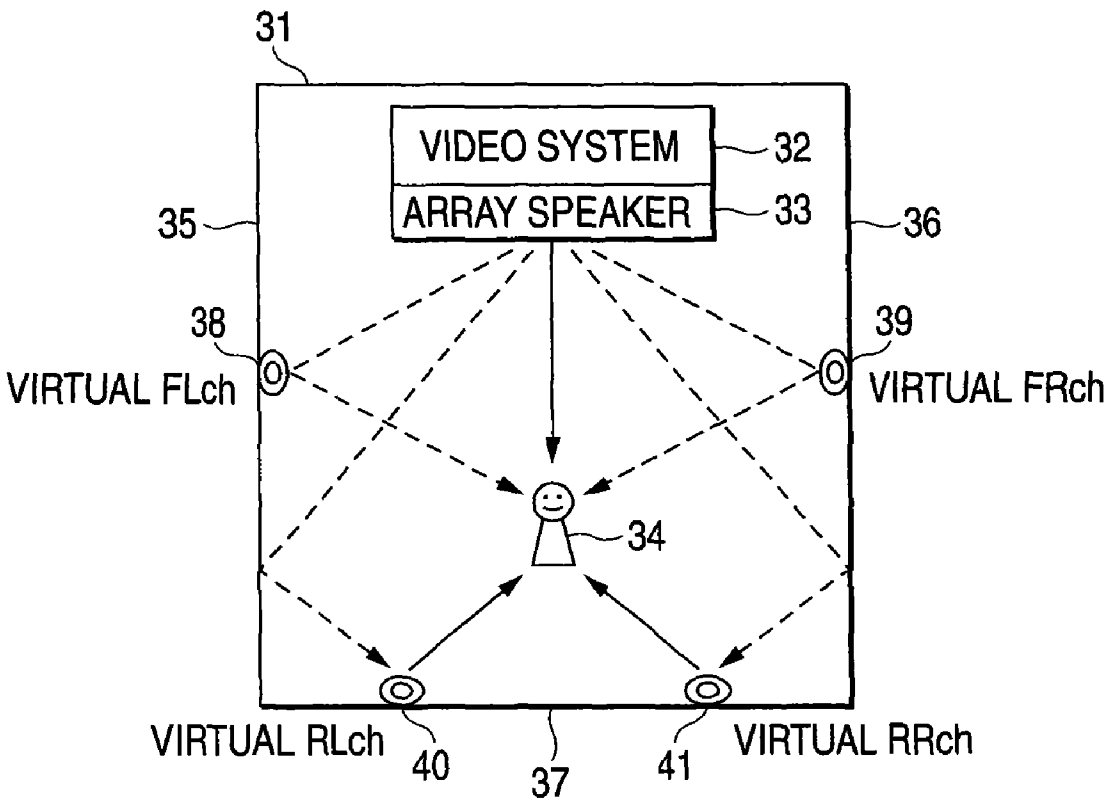
FIG. 3 A view showing a situation in which a multichannel surround sound field is generated by an array speaker.

In contrast, the high frequency components of the signals on the channels FL, FR, RL, RR are shaped into the beam respectively, and thus the virtual sound sources 38, 39, 40, 41 shown in above FIG. 3 are generated.

In more detail, the high frequency component of the signal passed through the HPF 11-1 on the RL channel (the signal having a frequency higher than the frequency f2) is set to a predetermined gain by a gain controlling portion 14-1, then the frequency characteristic of a resultant signal is corrected by a frequency characteristic correcting portion 15-1 to meet to the characteristic of the beam path, then a resultant signal is delayed in a predetermined time by a delay circuit 16-1 to make a compensation for a difference in a propagation delay time due to the beam path, and then a resultant signal is input into a directivity controlling portion 17-1. Delay circuits and level controlling circuits are provided to the directivity controlling portion 17-1 to correspond to n speaker units constituting the array speaker 20 respectively. An amount of delay is set to the signals output from the speaker units 20-1 to 20-*n* respectively such that the high frequency signal on the RL channel arrives at the listener via the path shown in FIG. 3, and also the window factor is multiplied to the signals by the level controlling circuits respectively to suppress the side lobes of the signal output from the array speaker 20. Thus, the output signals corresponding to respective speaker units are output. Accordingly, the high frequency signal on the RL channel is reflected from the left-side wall 35 and the rear wall 37 shown in FIG. 3, and thus the virtual sound source 40 is generated.

Similarly, the high frequency component of the signal passed through the HPF 11-2 on the FL channel (the signal having a frequency higher than the frequency f1) is input into a directivity controlling portion 17-2 for the signal on the FL channel via a gain controlling portion 14-2, a frequency characteristic correcting portion 15-2, and a delay circuit 16-2. Then, the signals to be output to respective speaker units 20-1 to 20-*n* are generated such that the high frequency signal on the FL channel constitutes the beam that is reflected from the left-side wall 35 to generate the virtual sound source 38.

Also, the high frequency component of the signal passed through the HPF 11-4 on the FR channel (the signal having a frequency higher than the frequency f1) is input into a directivity controlling portion 17-4 for the signal on the FR channel via a gain controlling portion 14-4, a frequency characteristic correcting portion 15-4, and a delay circuit 16-4. Then, the signals to be output to respective speaker units 20-1 to 20-*n* are generated such that the high frequency signal on the FR channel constitutes the beam that is reflected from the right-side wall 36 to generate the virtual sound source 39.

Further, the high frequency component of the signal passed through the HPF 11-5 on the RR channel (the signal having a frequency higher than the frequency f2) is input into a directivity controlling portion 17-5 for the signal on the RR channel via a gain controlling portion 14-5, a frequency characteristic correcting portion 15-5, and a delay circuit 16-5. Then, the signals to be output to respective speaker units 20-1 to 20-*n* are generated such that the high frequency signal on the RR channel constitutes the beam that is reflected from the right-side wall 36 and the rear-side wall 37 to generate the virtual sound source 41.

Also, the high frequency component of the signal passed through the HPF 11-3 on the C channel (the signal having a frequency higher than the frequency f0) is input into a directivity controlling portion 17-3 for the signal on the C channel via a gain controlling portion 14-3, a frequency characteristic correcting portion 15-3, and a delay circuit 16-3. Then, the signals to be output to respective speaker units 20-1 to 20-*n* are generated such that the signal having the forward directivity is output.

The signals output from the directivity controlling portions 17-1 to 17-5 to correspond to respective speaker units 20-1 to 20-*n* are added by adders 18-1 to 18-*n* provided to correspond to respective speaker units to generate output signals supplied to respective speaker units 20-1 to 20-*n*. Then, the output signals are amplified by power amplifiers 19-1 to 19-*n* provided to correspond to respective speaker units, and then output from the corresponding speaker units 20-1 to 20-*n*.

Since the systems subsequent to the adders 18-1 to 18-*n* including a space are the substantially linear systems, respective channels have the independent directivity as if the array speakers are provided to correspond to the number of channels (beams). The virtual sound sources are generated as shown in above FIG. 3 and the multichannel reproduction is implemented.

Next, the set values, etc. in the gain controlling portions 14-1 to 14-7, the frequency characteristic correcting portions 15-1 to 15-7, and the delay circuits 16-1 to 16-7 will be explained hereunder.

In the gain controlling portions 14-1 to 14-7, a gain is set in response to a distance of the beam path of each channel respectively such that a distance attenuation caused until the beam on each channel arrives at the listener can be compensated. That is, since distances of the rear channels (RL, RR) from the array speaker 20 to the listener are long and a distance attenuation is increased, respective gains (sound volumes) of the gain controlling portions 14-1 and 14-5 are set high to compensate this attenuation. Then, respective gains of the gain controlling portions 14-2 and 14-4 on the FL channel and the FR channel are set to a medium magnitude, and the gain of the gain controlling portion 14-3 on the C channel is set to "×1". Also, respective gains of the gain controlling portions 14-6 and 14-7 for the low frequency signal are set to compensate the attenuation containing differences in the efficiency and the number of the array speaker 20 and the woofers 21.

The frequency characteristic correcting portions 15-1 to 15-7 corrects the frequency characteristic to compensate differences in the characteristics (the wall reflection characteristic, and the like) of the beam passing path. For example, the frequency characteristic correcting portions 15-1, 15-2, 154, and 15-5 control the frequency characteristic to compensate the wall reflection characteristic.

The delay circuits 16-1 to 16-7 correct a difference in arrival times caused by the difference in the path lengths of respective beams. More particularly, no delay time (delay time=0) is set to the delay circuits 16-1 and 16-5 on the rear channels (RL, RR) that have the longest path to the listener, then a first delay time d1 that corresponds to differences in the path distances from the rear channels is set to the delay circuits 16-2 and 164 on the front channels (FL, FR), and then a second delay time d2 (d2>d1) that corresponds to differences in the path distances from the rear channels is set to the delay circuits 16-3, 16-6 and 16-7 on the center channel (C) and for the low frequency signals. As a result, all signals can arrive at the listener simultaneously.

In this manner, according to the array speaker system of the present invention, when the frequency band is divided into two bands and also the high frequency signal is shaped into the beam to generate the virtual sound sources and the low frequency signal is output not to constitute the beam, the crossover frequency is set to a different frequency on the front channels (FL, FR) and the rear channels (RL, RR) respectively and the signals in the higher frequency band than those in the front channels are shaped into the beam on the rear channels. As a result, the good sound image located more stably can be reproduced because the signals on the front channels (FL, FR) are shaped in the beam over the broad frequency band, while the problems of the above echolocation and time lag can be lessened because the signals on the rear channels are shaped in the narrow beam.

In the above explanation, two woofers are employed and the low frequency signals on respective left and right channels are reproduced. But a single woofer may be employed and the low frequency signals on all channels may be reproduced by the single woofer.

Figure 4:
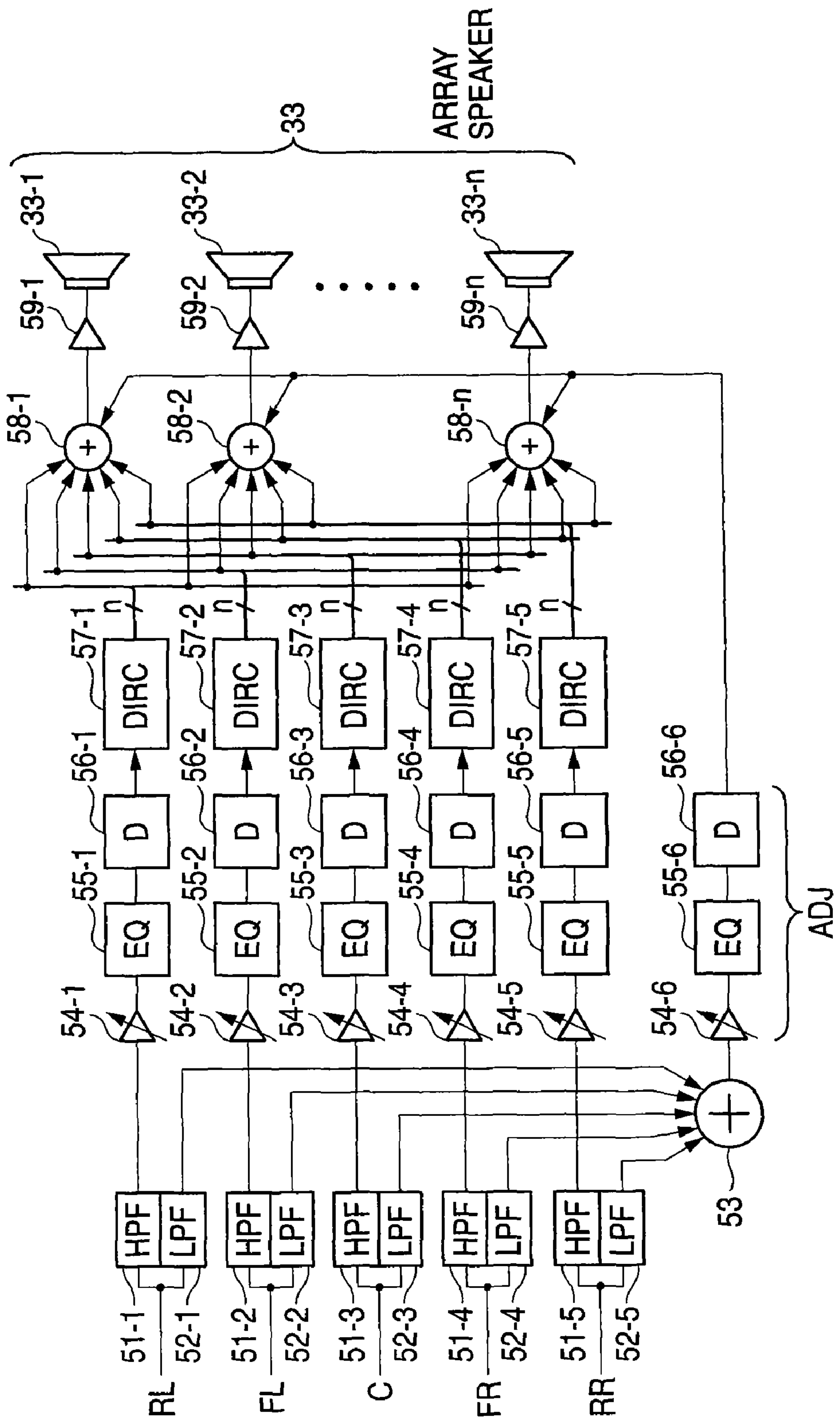
FIG. 4 A block diagram showing a configuration of the array speaker system that does not shape a low frequency band into a beam.
Figure 5:
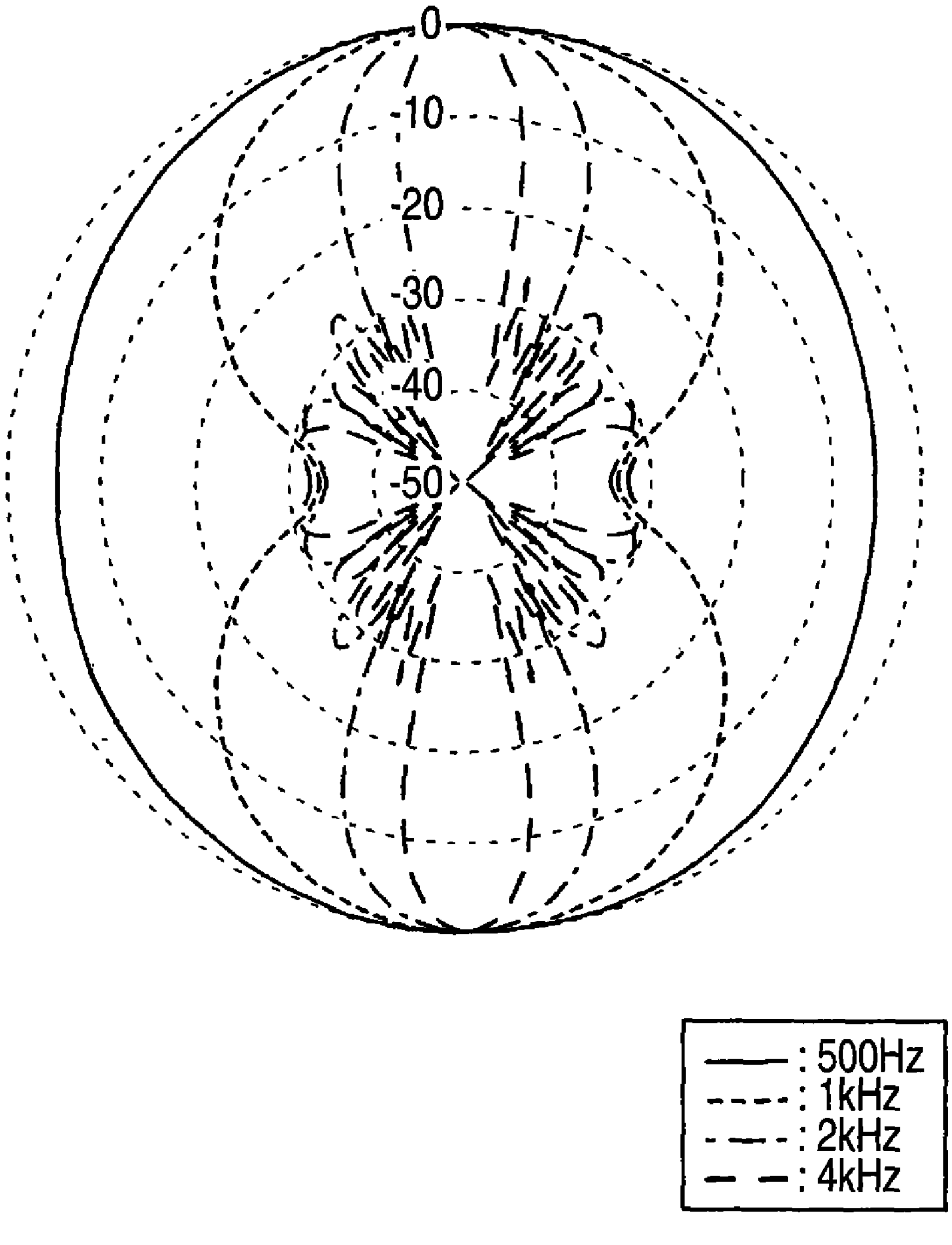
FIG. 5 A view showing an example of a directional pattern of the array speaker.

Also, in the above explanation, the case where the two-way system is employed is explained. But the present invention is not limited to this case. The present invention may be applied to the case where the two-way system is not employed as shown in FIG. 4, the case where the three-way system is employed, and the like.

In addition, in the above explanation, the case where five channels are employed is explained by way of example. But the present invention may be applied similarly to the case where other multichannel system such as 7.1 channels, or the like is employed.

The present invention is explained in detail with reference to the particular embodiment as above. It is apparent for those skilled in the art that various variations and modifications can be applied without departing a spirit, a scope, or an intended extent of the present invention.

This application is based upon Japanese Patent Application (Patent Application No. 2005-051099) filed on Feb. 25, 2005; the contents of which are incorporated herein by reference.

The invention claimed is:

1. An array speaker system, comprising:

array speakers which generate sound beams having a plurality of different directivities for generating a surround sound source containing front channels and rear channels by utilizing a wall reflection;

a frequency band dividing unit which divides a signal on the front channels into a first high frequency band signal and a first low frequency band signal at a first crossover frequency, and divides a signal on the rear channels into a second high frequency band signal and a second low frequency band signal at a second crossover frequency;

a first outputting unit which shapes the first high frequency band signal in the signal on the front channels in a frequency band higher than the first crossover frequency and the second high frequency band signal in the signal on the rear channels in a frequency band higher than the second crossover frequency into a sound beam, and then outputs shaped signals; and a second outputting unit outputs the first low frequency band signal in the signal on the front channels in a frequency band lower than the first crossover frequency and the second low frequency band signal in the signal on the rear channels in a frequency band lower than the second crossover frequency not to shape the signals into the sound beam;

wherein the second crossover frequency is set to a higher frequency than the first crossover frequency.

2. The array speaker system according to claim 1, further comprising:

a low frequency band reproducing speaker which is provided separately from the array speaker, wherein the low frequency band reproducing speaker outputs the first low frequency band signal and the second low frequency band signal.

* * * * *